(12) United States Patent
Matano

(10) Patent No.: US 11,892,862 B2
(45) Date of Patent: Feb. 6, 2024

(54) POWER SUPPLY CIRCUIT HAVING VOLTAGE SWITCHING FUNCTION

(71) Applicant: MICRON TECHNOLOGY, INC., Boise, ID (US)

(72) Inventor: Tatsuya Matano, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 17/461,585

(22) Filed: Aug. 30, 2021

(65) Prior Publication Data

US 2023/0067121 A1   Mar. 2, 2023

(51) Int. Cl.
G05F 1/567 (2006.01)
G05F 1/46 (2006.01)
H03K 17/14 (2006.01)

(52) U.S. Cl.
CPC .............. G05F 1/468 (2013.01); G05F 1/567 (2013.01); H03K 17/145 (2013.01)

(58) Field of Classification Search
CPC ..... G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/463; G05F 1/468; G05F 1/46; G05F 1/461; G05F 1/575; G05F 1/465; G05F 1/462; G05F 1/56; G05F 1/562; G05F 1/565; G05F 1/567; G05F 1/569; G05F 1/571; G05F 1/573; G05F 1/5735

See application file for complete search history.

(56) References Cited

U.S. PATENT DOCUMENTS

| 4,868,429 | A  | * | 9/1989  | Wolber    | H03G 11/00  |
|           |    |   |         |           | 327/310     |
| 5,497,112 | A  | * | 3/1996  | Hoang     | G01R 31/40  |
|           |    |   |         |           | 327/143     |
| 6,097,180 | A  | * | 8/2000  | Tsukude   | G11C 5/147  |
|           |    |   |         |           | 323/907     |
| 6,271,710 | B1 | * | 8/2001  | Ooishi    | G05F 3/262  |
|           |    |   |         |           | 327/512     |
| 6,957,278 | B1 | * | 10/2005 | Gallagher | H03K 5/084  |
|           |    |   |         |           | 327/66      |
| 7,292,491 | B2 | * | 11/2007 | Sinha     | G11C 11/40626 |
|           |    |   |         |           | 365/236     |
| 7,307,468 | B1 | * | 12/2007 | Vasudevan | G05F 3/30   |
|           |    |   |         |           | 327/539     |
| 8,878,512 | B2 | * | 11/2014 | Kondo     | G05F 3/30   |
|           |    |   |         |           | 323/315     |
| 10,268,228 | B2 | * | 4/2019 | Kundu     | G05F 3/02   |

(Continued)

*Primary Examiner* — Thienvu V Tran
*Assistant Examiner* — Nusrat Quddus
(74) *Attorney, Agent, or Firm* — Dorsey & Whitney LLP

(57) ABSTRACT

Disclosed herein is an apparatus that includes a first reference voltage generator configured to generate a first voltage, a second reference voltage generator configured to generate a second voltage, a detection circuit configured to compare the first voltage with the second voltage to generate a selection signal, and a selection circuit configured to select one of the first and second voltages responsive to the selection signal. The detection circuit is configured to have a hysteresis property in changing a state of the selection signal.

19 Claims, 7 Drawing Sheets

(56) References Cited

U.S. PATENT DOCUMENTS

| | | | | |
|---|---|---|---|---|
| 2004/0113681 A1* | 6/2004 | Sugimura | G05F 3/30 | 327/541 |
| 2007/0115032 A1* | 5/2007 | McClure | G01K 3/005 | 327/78 |
| 2007/0200546 A1* | 8/2007 | Logiudice | G05F 3/30 | 323/316 |
| 2009/0051392 A1* | 2/2009 | Maeda | H03M 1/125 | 327/72 |
| 2009/0066313 A1* | 3/2009 | Kimura | G05F 3/262 | 323/313 |
| 2009/0231770 A1* | 9/2009 | Schuelke | H02H 3/24 | 361/92 |
| 2010/0164565 A1* | 7/2010 | Takeuchi | H03K 17/223 | 327/143 |
| 2011/0050286 A1* | 3/2011 | Son | G01K 7/01 | 327/72 |
| 2012/0200343 A1* | 8/2012 | Hirobe | G05F 3/30 | 327/539 |
| 2013/0328615 A1* | 12/2013 | Sano | G05F 3/30 | 327/513 |
| 2014/0062452 A1* | 3/2014 | Ok | G05F 3/16 | 323/313 |
| 2014/0084989 A1* | 3/2014 | Fujime | G05F 1/575 | 327/513 |
| 2014/0218101 A1* | 8/2014 | Ham | H03K 3/011 | 327/540 |
| 2015/0309527 A1* | 10/2015 | Pavao-Moreira | G05F 3/262 | 323/315 |
| 2016/0098047 A1* | 4/2016 | Abhishek | G05F 1/462 | 327/307 |
| 2017/0011806 A1* | 1/2017 | Gangasani | H03K 3/0231 | |
| 2017/0331270 A1* | 11/2017 | Mattos | H02H 1/0007 | |
| 2018/0172758 A1* | 6/2018 | Kashima | G01R 19/16566 | |
| 2021/0157348 A1* | 5/2021 | Murakami | G05F 3/245 | |

* cited by examiner

POWER SUPPLY CIRCUIT HAVING VOLTAGE SWITCHING FUNCTION

BACKGROUND

Many semiconductor devices such as a DRAM (Dynamic Random Access Memory) include a power-supply circuit that generates an internal power-supply voltage. Such a power-supply circuit is sometimes configured to generate an internal power-supply voltage having a temperature dependency. However, when the power-supply circuit is configured to provide the internal power-supply voltage with a temperature dependency in a first temperature range and provide the internal power-supply voltage with no temperature dependency in a second temperature range, the internal power-supply voltage may become unstable at the time of switching from the first temperature range to the second temperature range or switching from the second temperature range to the first temperature range. Therefore, a power-supply circuit that can generate an internal power-supply voltage stable also at a boundary between the first temperature range and the second temperature range has been demanded.

DETAILED DESCRIPTION

Various embodiments of the present disclosure will be explained below in detail with reference to the accompanying drawings. The following detailed description refers to the accompanying drawings that show, by way of illustration, specific aspects, and embodiments in which the present disclosure may be practiced. These embodiments are described in sufficient detail to enable those skilled in the art to practice the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
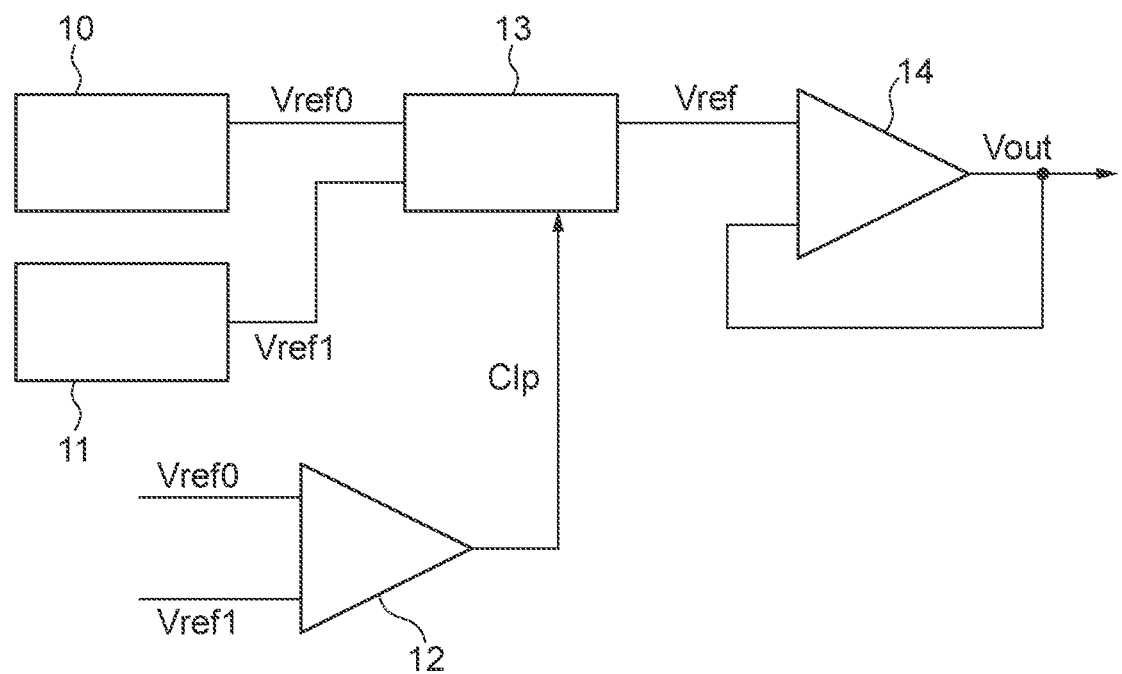
FIG. 1 is a block diagram showing a basic configuration of a power-supply circuit according to an embodiment of the present disclosure.

FIG. 1 is a block diagram showing a basic configuration of a power-supply circuit according to an embodiment of the present disclosure. The power-supply circuit shown in FIG. 1 includes a reference voltage generation circuit 10 that generates a reference voltage Vref, a reference voltage generation circuit 11 that generates a reference voltage Vref1, a detection circuit 12 that compares the reference voltage Vref0 with the reference voltage Vref1 to generate a selection signal Clp, a selection circuit 13 that selects one of the reference voltages Vref0 and Vref1 responsive to the selection signal Clp, and an internal voltage generation circuit 14 that generates an internal power-supply voltage Vout based on the reference voltage Vref output from the selection circuit 13.

Figure 2:
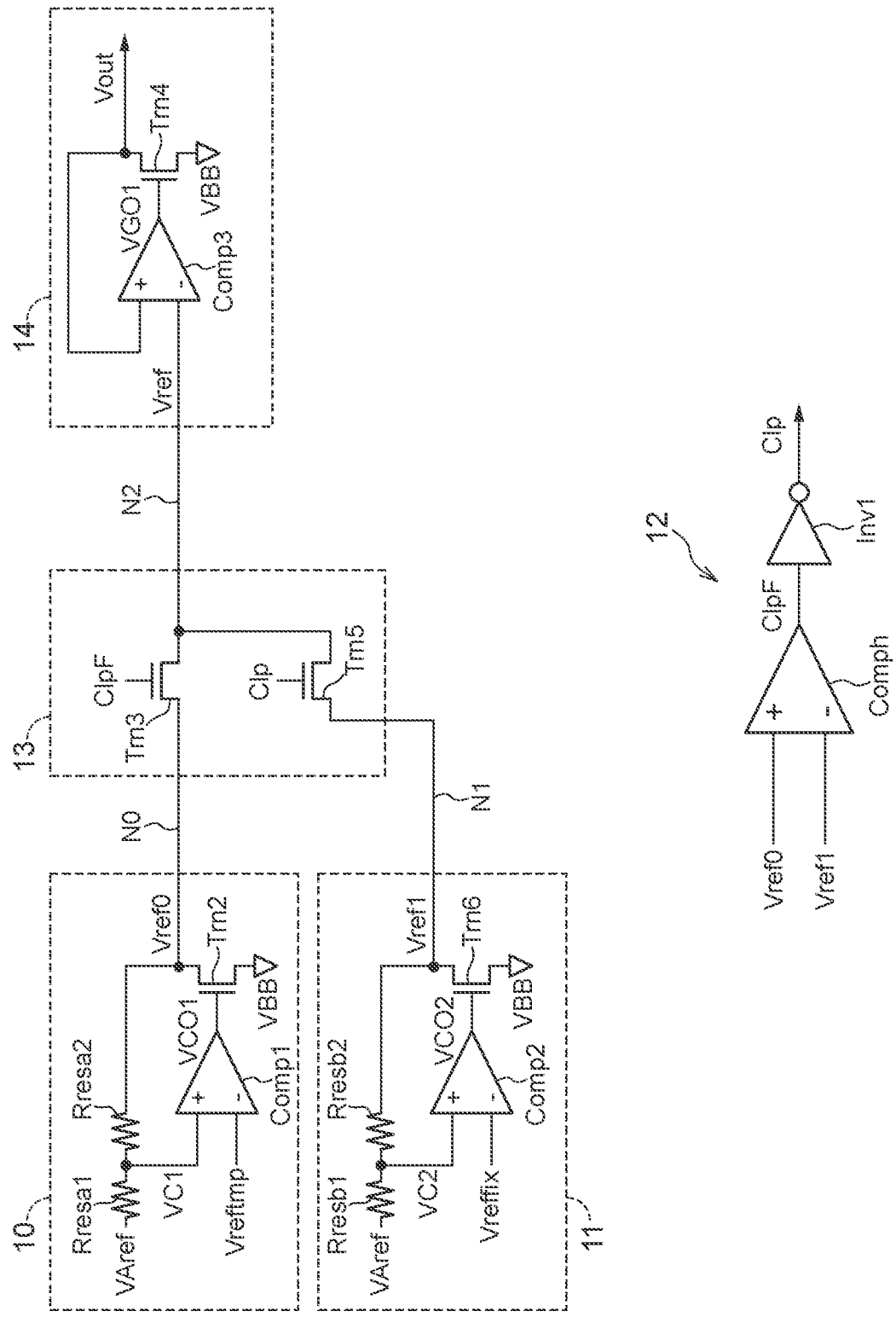
FIG. 2 is a circuit diagram of the power-supply circuit according to an embodiment of the present disclosure.

FIG. 2 is a circuit diagram of the power-supply circuit according to an embodiment of the present disclosure. As shown in FIG. 2, the reference voltage generation circuit 10 includes a comparator Comp1 that compares a voltage VC1 with a voltage Vreftmp, resistors Rresa1 and Rresa2 coupled in series with each other, and an N-channel MOS transistor Tm2. A constant voltage VAref is applied to one end of the resistor Rresa1. The voltage VC1 appears at a connection point between the resistors Rresa1 and Rresa2. An output signal VCO1 of the comparator Comp1 is supplied to the gate electrode of the transistor Tm2 and a voltage VBB is supplied to the source of the transistor Tm2. The reference voltage Vref0 is output from the drain of the transistor Tm2. The voltage Vreftmp has a temperature dependency and the potential thereof decreases with increases of the temperature. With this configuration, when the voltage VC1 is higher than the voltage Vreftmp, the output signal VCO1 of the comparator Comp1 has a high level and the transistor Tm2 is turned on. As a result, the level of the reference voltage Vref0 decreases. Conversely, when the voltage VC1 is lower than the voltage Vreftmp, the output signal VCO1 of the comparator Comp1 has a low level and the transistor Tm2 is turned off. As a result, the level of the reference voltage Vref0 increases. In this way, the reference voltage generation circuit 10 outputs the reference voltage Vref0 corresponding to the voltage Vreftmp having a temperature dependency. The level of the reference voltage Vref0 is represented by the following expression.

$$Vref0 = ((Rresa1 + Rresa2)/Rresa1) \times Vreftmp - (Rresa2/Rresa1) \times VAref$$

The reference voltage generation circuit 11 includes a comparator Comp2 that compares a voltage VC2 with a voltage Vreffix, resistors Rresb1 and Rresb2 coupled in series with each other, and an N-channel MOS transistor Trn6. The constant voltage VAref is applied to one end of the resistor Rresb1. The voltage VC2 appears at a connection point between the resistors Rresb1 and Rresb2. An output signal VCO2 of the comparator Comp2 is supplied to the gate electrode of the transistor Trn6 and the voltage VBB is supplied to the source of the transistor Tm6. The reference voltage Vref1 is output from the drain of the transistor Trn6. The voltage Vreffix has no temperature dependency and the level thereof is fixed regardless of the temperature. With this configuration, when the voltage VC2 is higher than the voltage Vreffix, the output signal VCO2 of the comparator Comp2 has a high level and the transistor Tm6 is turned on. As a result, the level of the reference voltage Vref1 decreases. Conversely, when the voltage VC2 is lower than the voltage Vreffix, the output signal VCO2 of the comparator Comp2 has a low level and the transistor Tm6 is turned off. As a result, the level of the reference voltage Vref1 increases. In this way, the reference voltage generation circuit 11 outputs the reference voltage Vref1 corresponding to the voltage Vreffix having no temperature dependency. The level of the reference voltage Vref1 is represented by the following expression.

$$Vref1 = ((Rresb1 + Rresb2)/Rresb1) \times Vreffix - (Rresb2/Rresb1) \times VAref$$

The decision circuit 12 includes a comparator Comph that compares the reference voltage Vref0 with the reference voltage Vref1 to generate a selection signal ClpF, and an inverter circuit Inv1 that inverts the selection signal ClpF to generate the selection signal Clp. Therefore, the selection signal Clp and the selection signal ClpF are signals complementary with each other and one thereof has a high level while the other has a low level.

The selection circuit 13 includes N-channel MOS transistors Tm3 and Tm5. The transistor Trn3 is coupled between an input node NO where the reference voltage Vref0 appears and an output node N2, and the selection signal ClpF is supplied to the gate electrode thereof. The transistor Tm5 is coupled between an input node N1 where the reference voltage Vref1 appears and the output node N2 and the selection signal Clp is supplied to the gate electrode thereof. With this configuration, when the selection signal Clp has a low level and the selection signal ClpF has a high level, the transistor Trn3 is turned on and the level of the reference voltage Vref output to the node N2 matches the level of the reference voltage Vref0. On the other hand, when the selection signal Clp has a high level and the selection signal ClpF has a low level, the transistor Trn5 is turned on and the level of the reference voltage Vref output to the output node N2 matches the level of the reference voltage Vref1.

The internal voltage generation circuit 14 includes a comparator Comp3 and an N-channel MOS transistor Tm4. The comparator Comp3 compares the internal power-supply voltage Vout with the reference voltage Vref to generate an output signal VGO1. The output signal VGO1 is supplied to the gate electrode of the transistor Tm4. The voltage VBB is supplied to the source of the transistor Trn4. The internal power-supply voltage Vout is output from the drain of the transistor Tm4. With this configuration, when the internal power-supply voltage Vout is higher than the reference voltage Vref, the output signal VGO1 of the comparator Comp3 has a high level and the transistor Tm4 is turned on. As a result, the level of the internal power-supply voltage Vout decreases. Conversely, when the internal power-supply voltage Vout is lower than the reference voltage Vref, the output signal VGO1 of the comparator Comp3 has a low level and the transistor Tm4 is turned off. As a result, the level of the internal power-supply voltage Vout increases. In the example shown in FIG. 2, the level of the internal power-supply voltage Vout matches the level of the reference voltage Vref.

Figure 3:
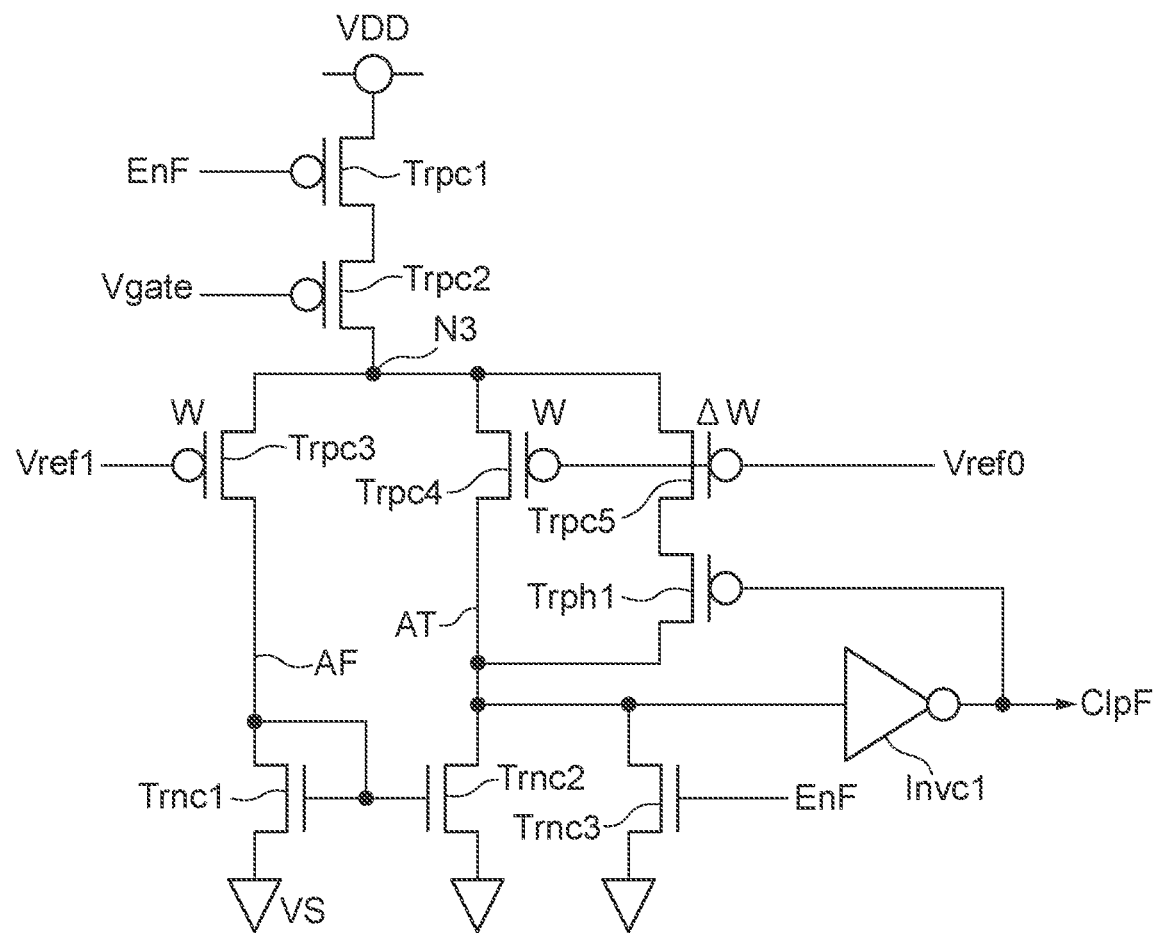
FIG. 3 is a circuit diagram of a comparator according to a first embodiment of the present disclosure.

FIG. 3 is a circuit diagram of the comparator Comph according to the first embodiment of the present disclosure. The comparator Comph according to the first embodiment includes P-channel MOS transistors Trpc1 and Trpc2 coupled in series between a power-supply line supplied with a power-supply voltage VDD and a common node N3, a P-channel MOS transistor Trpc3 coupled between the common node N3 and an input current path AF, a P-channel MOS transistor Trpc4 coupled between the common node N3 and an output current path AT, N-channel MOS transistors Tmc1 and Tmc2 constituting a current mirror circuit, an N-channel MOS transistor Trnc3 coupled in parallel with the transistor Tmc2, P-channel MOS transistors Trpc5 and Trph1 coupled in parallel with the transistor Trpc4 and coupled in series with each other, and an inverter circuit Invc1 coupled to the output current path AT. An output of the inverter circuit Invc1 is the selection signal ClpF.

An enable signal EnF is input to the gate electrodes of the transistors Trpc1 and Trnc3. The enable signal EnF is a signal for activating the comparator Comph. When the enable signal EnF has a low level, the transistor Trpc1 is turned on and a current is supplied to the common node N3. Accordingly, an operating current is supplied to the current mirror circuit and the comparator Comph is therefore activated. The amount of the current supplied to the common node N3 is adjusted by a control voltage Vgate supplied to the gate electrode of the transistor Trpc2. On the other hand, when the enable signal EnF has a high level, the transistor Trpc1 is turned off, the current supply to the common node N3 is stopped, and the transistor Trnc3 is turned on, so that the output current path AT is fixed to a low level. Accordingly, the comparator Comph is deactivated.

The transistor Tmc1 constitutes an input-side transistor of the current mirror circuit and the drain and the gate electrode thereof are coupled to the gate electrode of the transistor Tmc2 constituting an output-side transistor of the current mirror circuit. The transistors Trpc3 and Trpc4 constitutes a pair of differential input transistors. The reference voltage Vref1 is supplied to the gate electrode of the transistor Trpc3 and the reference voltage Vref0 is supplied to the gate electrode of the transistor Trpc4. The channel widths of the transistors Trpc3 and Trpc4 are both W. That is, the transistor sizes of the transistors Trpc3 and Trpc4 are equal to each other. The transistors Trpc5 and Trph1 constitute a first additional current path. The reference voltage Vref0 is supplied to the gate electrode of the transistor Trpc5. The selection signal ClpF is fed back to the gate electrode of the transistor Trph1. The channel width of the transistor Trpc5 is $\Delta W$ ($<W$). The transistor size of the transistor Trph1 is sufficiently larger than that of the transistor Trpc5.

With this configuration, the comparator Comph shown in FIG. 3 compares the level of the reference voltage Vref0 with the level of the reference voltage Vref1 and generates the selection signal ClpF based on a result of the comparison. When the selection signal ClpF has a high level, the first additional current path is disabled and the size of transistors coupled to the input current path AF and the size of transistors coupled to the output current path AT become equal to each other. On the other hand, when the selection signal ClpF has a low level, the first additional current path is enabled and therefore the size of transistors coupled to the output current path AT becomes larger than the size of transistors coupled to the input current path AF.

Figure 4A:
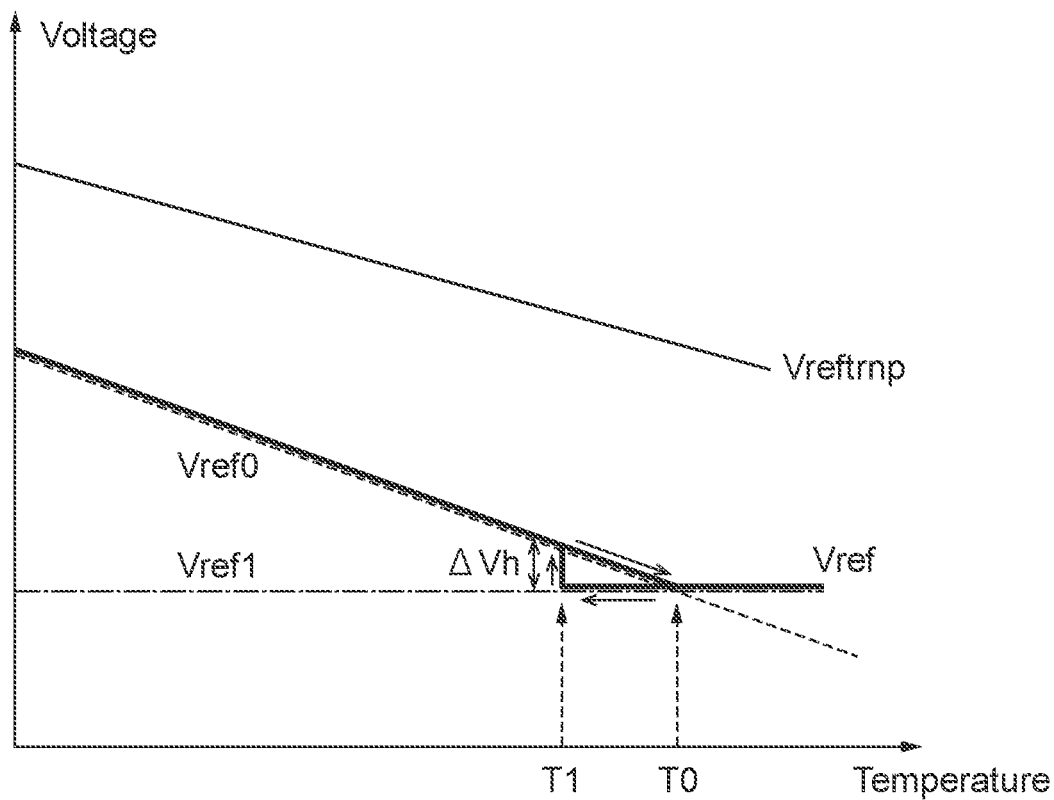
FIG. 4A is a graph showing a relation between a temperature and a reference voltage.

FIG. 4A is a graph showing a relation between a temperature and a reference voltage. As shown in FIG. 4A, the reference voltage Vref0 has a temperature dependency and the level decreases as the temperature rises. The reference voltage Vref1 has no temperature dependency. A case in which the temperature rises when the temperature is lower than TO is first assumed. Since Vref0>Vref1 in this case, the selection signal ClpF output from the comparator Comph has a high level and the selection signal Clp has a low level. Accordingly, the transistor Trn3 included in the selection circuit 13 as shown in FIG. 2 is turned on and the transistor Tm5 is turned off, so that the input node NO and the output node N2 are short-circuited and the internal power-supply voltage Vout matches the reference voltage Vref0. The transistor Trph1 is turned off and the first additional current path is therefore disabled. In this case, the current supply capabilities of transistors coupled to the input current path AF and the output current path AT of the current mirror circuit match each other.

Figure 4B:
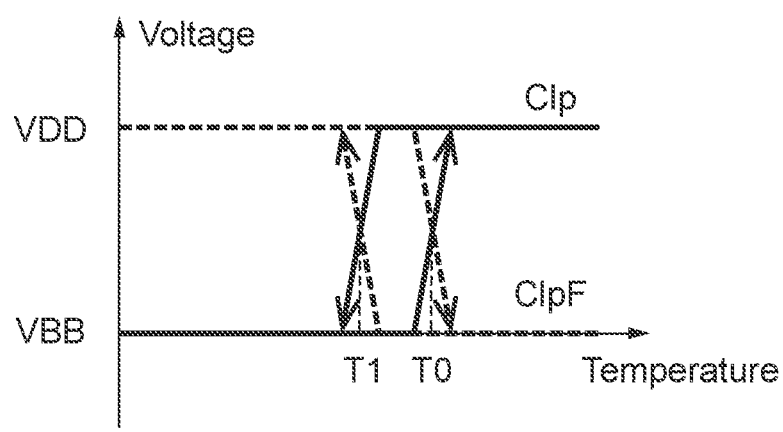
FIG. 4B is a timing chart showing a relation between a temperature and a selection signal.

The reference voltage Vref0 has the temperature dependency and the level thereof decreases as the temperature rises. Since Vref0<Vref1 when the temperature exceeds TO, the selection signal ClpF output from the comparator Comph changes to a low level and the selection signal Clp changes to a high level as shown in FIG. 4B. Accordingly, the transistor Tm5 included in the selection circuit 13 is turned on and the transistor Tm3 is turned off, so that the input node N1 and the output node N2 are short-circuited and the internal power-supply voltage Vout matches the reference voltage Vref1. At this time, noticeable noise does not occur in the reference voltage generation circuits 10 and 11 and the levels of the signals stably transition. When the selection signal ClpF changes to a low level, the transistor Trph1 is turned on and the first additional current path is therefore enabled. In this case, the current supply capability of transistors coupled to the output current path AT of the current mirror circuit is higher than the current supply capability of transistors coupled to the input current path AF. Therefore, even if noise is added to the voltage VC1 after the selection signal ClpF transitions to a low level, the selection signal ClpF is less likely to transition to a high level unless the temperature decreases because the current of the first additional current path is added to the current flowing in the output current path AT.

Next, a case in which the temperature decreases when the temperature is above T0 is assumed next. In this case, since the current of the first additional current path is added to the current flowing in the output current path AT, the selection signal ClpF is not inverted even when the temperature falls below T0, and the selection signal ClpF is first inverted when the temperature falls below T1 (<T0). That is, the threshold changes by ΔVh according to the current of the first additional current path. When the temperature falls below T1, the selection signal ClpF output from the comparator Comph changes to a high level and the selection signal Clp changes to a low level as shown in FIG. 4B. Accordingly, the internal power-supply voltage Vout matches again the reference voltage Vref0. Since the transistor Trph1 is turned off, the first additional current path is disabled. The internal power-supply voltage Vout has already been Vref1+ΔVh at this stage and the current flowing in the transistor Trpc3 is sufficiently larger than the current flowing in the transistor Trpc4. Therefore, the selection signal ClpF is less likely to transition to a low level even when noise is added to the voltage VC1.

As described above, since the comparator Comph shown in FIG. 3 has a hysteresis property with respect to changes of the selection signal ClpF, the noise resistance is high and a stable circuit operation can be realized.

Figure 5:
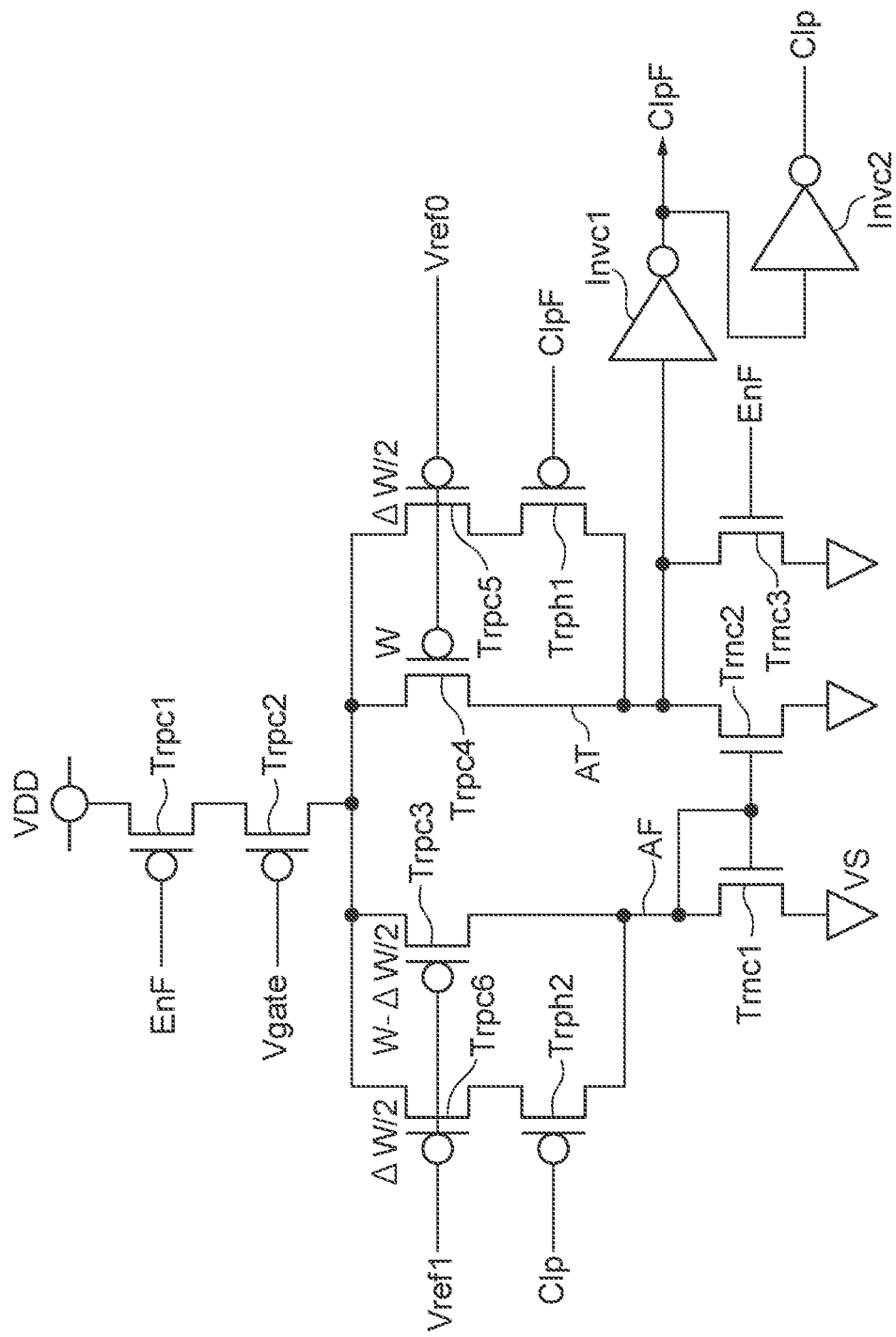
FIG. 5 is a circuit diagram of a comparator according to a second embodiment of the present disclosure.

FIG. 5 is a circuit diagram of a comparator Comph according to a second embodiment of the present disclosure. The comparator Comph shown in FIG. 5 is different from the comparator Comph shown in FIG. 3 in that P-channel MOS transistors Trpc6 and Trph2 coupled in parallel with the transistor Trpc3 and coupled in series with each other are added. The transistors Trpc6 and Trph2 constitute a second additional current path. The reference voltage Vref1 is supplied to the gate electrode of the transistor Trpc6. The selection signal Clp is fed back to the gate electrode of the transistor Trph2. The selection signal Clp is generated by an inverter circuit Invc2. The output of the inverter circuit Inv1 shown in FIG. 2 may be fed back as it is to the gate electrode of the transistor Trph2. In the present embodiment, the channel width of the transistor Trpc3 is W−ΔW/2 and the channel width of the transistor Trpc4 is W. That is, the transistor sizes of the transistors Trpc3 and Trpc4 are different from each other. The channel widths of the transistors Trpc5 and Trpc6 are both ΔW/2.

With this configuration, when the selection signal ClpF has a high level, the first additional current path is disabled and the second additional current path is enabled, so that the size of transistors coupled to the input current path AF and the size of transistors coupled to the output current path AT become equal to each other. In contrast thereto, when the selection signal ClpF has a low level, the second additional current path is disabled and the first additional current path is enabled, so that the size of transistors coupled to the output current path AT become larger than the size of transistors coupled to the input current path AF. Accordingly, the same function as that of the comparator Comph according to the first embodiment can be realized. Furthermore, the comparator Comph according to the second embodiment has a symmetric structure in which the additional current paths are provided to both the input current path AF and the output current path AT, respectively, and the circuit operation is therefore more stabilized.

Figure 6:
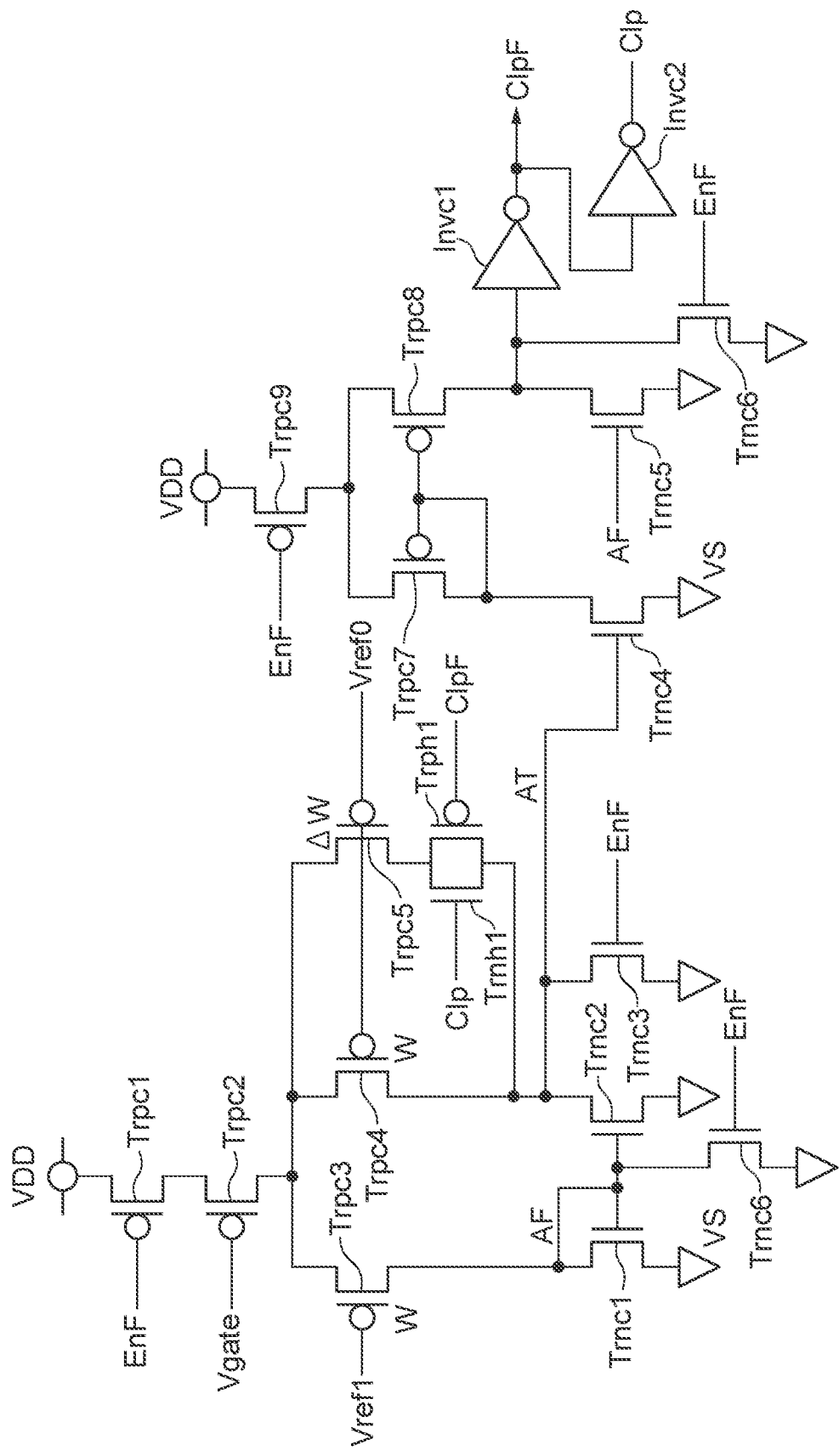
FIG. 6 is a circuit diagram of a comparator according to a third embodiment of the present disclosure.

FIG. 6 is a circuit diagram of a comparator Comph according to a third embodiment of the present disclosure. The comparator Comph shown in FIG. 6 is different from the comparator Comph shown in FIG. 3 in that a buffer circuit coupled to the input current path AF and the output current path AT is added. The buffer circuit includes P-channel MOS transistors Trpc7 and Trpc8 constituting a current mirror circuit, a P-channel MOS transistor Trpc9 flowing an operation current to the current mirror circuit, an N-channel MOS transistor Tmc4 coupled in series with the transistor Trpc7, an N-channel MOS transistor Trnc5 coupled in series with the transistor Trpc8, and an N-channel MOS transistor Tmc6 coupled in parallel with the transistor Tmc5. The gate electrode of the transistor Trnc4 is coupled to the output current path AT, and the gate electrode of the transistor Tmc5 is coupled to the input current path AF. The enable signal EnF is input to the gate electrodes of the transistors Trpc9 and Tmc6. With this configuration, a potential difference between the input current path AF and the output current path AT is promptly amplified. In the example shown in FIG. 6, an N-channel MOS transistor Tmh1 is coupled in parallel with the transistor Trph1 included in the additional current path. The selection signal Clp is supplied to the gate electrode of the transistor Tmh1. Accordingly, the transistors Trph1 and Tmh1 constitute a transfer gate.

Figure 7:
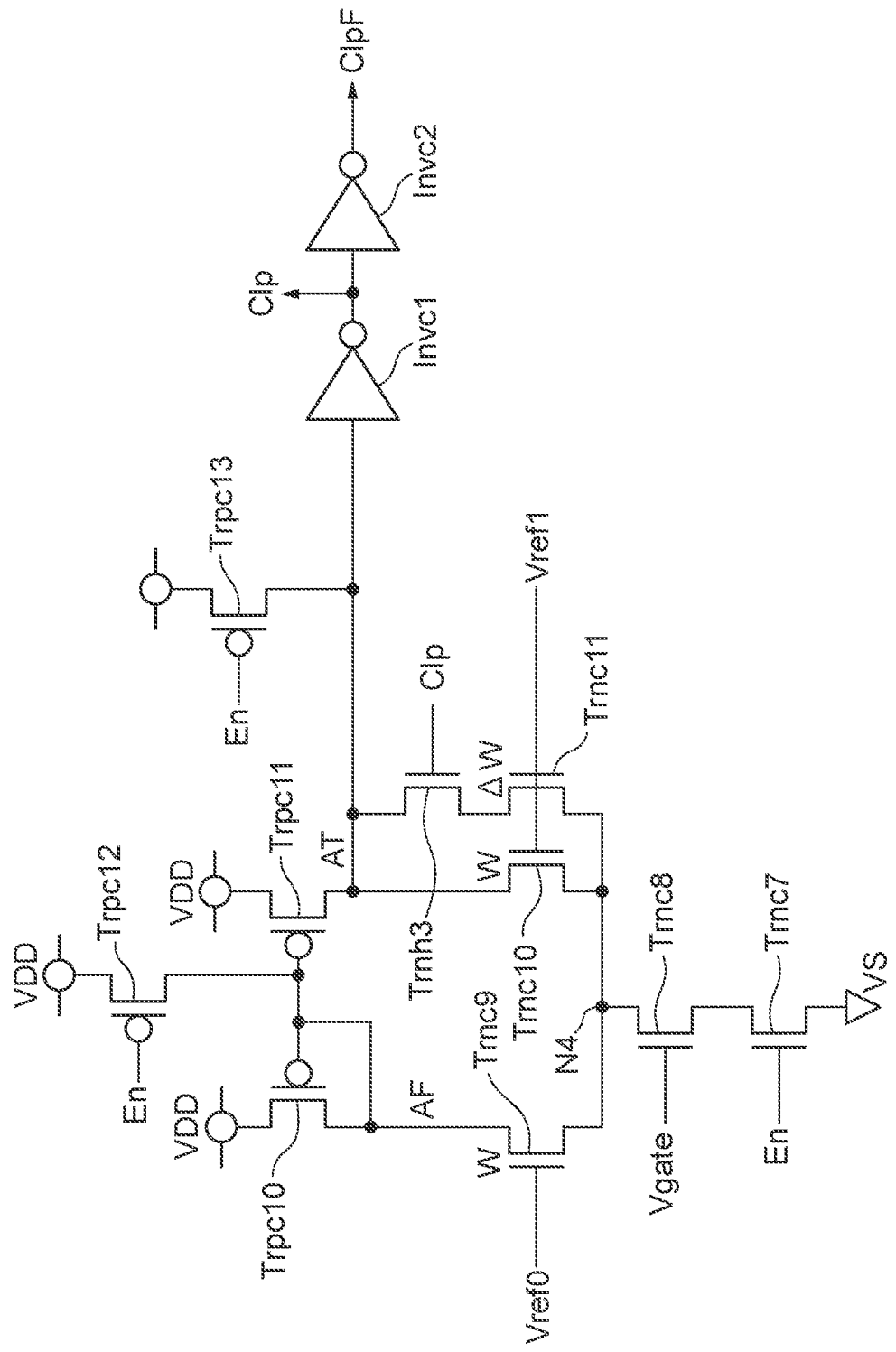
FIG. 7 is a circuit diagram of a comparator according to a fourth embodiment of the present disclosure.

FIG. 7 is a circuit diagram of a comparator Comph according to a fourth embodiment of the present disclosure. The comparator Comph shown in FIG. 7 is different from the comparator Comph shown in FIG. 3 in that the polarities are inverted. The comparator Comph according to the fourth embodiment includes N-channel MOS transistors Tmc7 and Tmc8 coupled in series between a power-supply line supplied with a ground voltage VS and a common node N4, an N-channel MOS transistor Tmc9 coupled between the common node N4 and the input current path AF, an N-channel MOS transistor Tmc10 coupled between the common node N4 and the output current path AT, P-channel MOS transistors Trpc10 and Trpc11 constituting a current mirror circuit, a P-channel MOS transistor Trpc13 coupled between the output current path AT and a power-supply line supplied with the power-supply voltage VDD, N-channel MOS transistors Tmc11 and Tmh3 coupled in parallel with the transistor Tmc10 and coupled in series with each other, a P-channel MOS transistor Trpc12 coupled between the power-supply line supplied with the power-supply voltage VDD and the gate electrodes of the transistors Trpc10 and Trpc11, and the inverter circuits Invc1 and Invc2 coupled to the output current path AT. An output of the inverter circuit Invc2 is the selection signal ClpF.

An enable signal En is input to the gate electrodes of the transistors Tmc7, Trpc12, and Trpc13. When the enable signal En has a high level, the transistor Tmc7 is turned on and a current is supplied to the common node N4. Since the current is accordingly supplied to the current mirror circuit, the comparator Comph is activated. The amount of the current supplied to the common node N4 is adjusted by the control voltage Vgate supplied to the gate electrode of the transistor Tmc8.

The transistor Trpc10 constitutes an input-side transistor of the current mirror circuit and the drain and the gate electrode thereof are coupled to the gate electrode of the transistor Trpc11 constituting an output-side transistor of the current mirror circuit. The transistors Tmc9 and Trnc10 constitute a pair of differential input transistors. The reference voltage Vref0 is supplied to the gate electrode of the transistor Tmc9 and the reference voltage Vref1 is supplied to the gate electrode of the transistor Tmc10. The channel widths of the transistors Tmc9 and Tmc10 are both W The transistors Tmc11 and Tmh3 constitutes an additional current path. The reference voltage Vref1 is supplied to the gate electrode of the transistor Tmc11. The selection signal Clp is fed back to the gate electrode of the transistor Tmh3. The channel width of the transistor Tmc11 is ΔW.

The comparator Comph having the configuration described above is suitable for a case in which the levels of the reference voltages Vref0 and Vref1 are relatively high.

As explained above, since the comparators Comph according to the first to fourth embodiments have a hysteresis property with respect to changes of the selection signal Clp or ClpF, the noise resistance is high and a stable circuit operation can be realized. The comparators Comph according to the first to fourth embodiment fixes the level of the internal power-supply voltage Vout when the temperature exceeds TO. However, the internal power-supply voltage Vout may be fixed to a different level when the temperature has become equal to or lower than a predetermined temperature. The present disclosure is similarly applicable also to a power-supply circuit that switches over voltages according to a parameter other than temperature changes.

Although this disclosure has been disclosed in the context of certain preferred embodiments and examples, it will be understood by those skilled in the art that the disclosures extend beyond the specifically disclosed embodiments to other alternative embodiments and/or uses of the disclosures and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosures. It should be understood that various features and aspects of the disclosed embodiments can be combined with or substituted for one another in order to form varying mode of the disclosed embodiments. Thus, it is intended that the scope of at least some of the present disclosure herein disclosed should not be limited by the particular disclosed embodiments described above.

The invention claimed is:

1. An apparatus comprising:
a first reference voltage generator configured to generate a first voltage;
a second reference voltage generator configured to generate a second voltage;
a detection circuit configured to compare the first voltage with the second voltage to generate a selection signal; and
a selection circuit configured to select one of the first and second voltages responsive to the selection signal,
wherein the detection circuit is configured to have a hysteresis property in changing a state of the selection signal,
wherein the detection circuit includes a current mirror circuit having an input current path flowing an input current controlled by one of the first and second voltages and an output current path flowing an output current controlled by other of the first and second voltages,
wherein the current mirror circuit further includes a first additional current path coupled in parallel with one of the input current path and the output current path, and
wherein the first additional current path is configured to be enabled responsive to the selection signal.

2. The apparatus of claim 1, wherein the first reference voltage generator is configured to control a level of the first voltage according to a temperature.

3. The apparatus of claim 2, wherein the second reference voltage generator is configured to generate the second voltage having a fixed level regardless of the temperature.

4. The apparatus of claim 3, wherein the detection circuit is configured to change the selection signal from a first state to a second state at a first temperature.

5. The apparatus of claim 4, wherein the detection circuit is configured to change the selection signal from the second state to the first state at a second temperature different from the first temperature.

6. The apparatus of claim 5, wherein the selection circuit is configured to select the first voltage when the selection signal is in the first state and select the second voltage when the selection signal is in the second state.

7. The apparatus of claim 1, wherein the output current path includes substantially a same current supply capability as the input current path.

8. The apparatus of claim 1,
wherein the current mirror circuit further includes a second additional current path coupled in parallel with other of the input current path and the output current path, and
wherein one of the first and second additional current paths is configured to be exclusively enabled responsive to the selection signal.

9. The apparatus of claim 8, wherein the output current path has a different current supply capability from the input current path.

10. An apparatus comprising:
a first reference voltage generator configured to generate a first voltage;
a second reference voltage generator configured to generate a second voltage;
a detection circuit configured to compare the first voltage with the second voltage to generate a selection signal; and
a selection circuit configured to select the first voltage when the selection signal is in a first state and select the second voltage when the selection signal is in a second state,
wherein at least one of the first and second voltages has a temperature dependency,
wherein the detection circuit is configured to change the selection signal from the first state to the second state at a first temperature when increasing temperature and change the selection signal from the second state to the first state at a second temperature lower than the first temperature when decreasing temperature,
wherein the detection circuit includes a current mirror circuit having an input current path flowing an input current controlled by one of the first and second voltages and an output current path flowing an output current controlled by other of the first and second voltages, wherein the current mirror circuit further includes a first additional current path coupled in parallel with one of the input current path and the output current path, and wherein the first additional current path is configured to be enabled responsive to the selection signal.

11. The apparatus of claim 10, wherein the first voltage has a temperature dependency, and the second voltage has no temperature dependency.

12. The apparatus of claim 10, wherein the second voltage has a temperature dependency, and the first voltage has no temperature dependency.

13. An apparatus comprising:
a current mirror circuit having an input current path and an output current path;
a first transistor coupled in series with the input current path and controlled by a first reference voltage;
a second transistor coupled in series with the output current path and controlled by a second reference voltage;
a first additional current path coupled in parallel with one of the first and second transistors; and
an output circuit coupled to the output current path to generate a first selection signal,
wherein the first additional current path includes a third transistor controlled by one of the first and second reference voltages and a fourth transistor coupled in series with the third transistor, and wherein the fourth transistor is configured to be activated responsive to the first selection signal.

14. The apparatus of claim 13, wherein the first and second transistors have a same transistor size as each other.

15. The apparatus of claim 13, further comprising a second additional current path coupled in parallel with other of the first and second transistors,
wherein the output circuit is configured to generate a second selection signal complementary with the first selection signal,
wherein the second additional current path includes a fifth transistor controlled by the other of the first and second reference voltages and a sixth transistor coupled in series with the fifth transistor, and
wherein the sixth transistor is configured to be activated responsive to the second output signal.

16. The apparatus of claim 15, wherein the first and second transistors have a different transistor size from each other.

17. The apparatus of claim 16, wherein the third and fifth transistors have a same transistor size as each other.

18. The apparatus of claim 13, further comprising:
a first reference voltage generator configured to generate the first voltage;
a second reference voltage generator configured to generate the second voltage; and
a selection circuit configured to select one of the first and second voltages responsive to the first selection signal.

19. The apparatus of claim 18, wherein one of the first and second voltages has a temperature dependency, and other of the first and second voltages has no temperature dependency.

* * * * *